(12) United States Patent
Roden et al.

(10) Patent No.: US 6,320,748 B1
(45) Date of Patent: Nov. 20, 2001

(54) POWER HEATSINK FOR A CIRCUIT BOARD

(75) Inventors: Garey G. Roden, Apalachin, NY (US); Peter G. Heseltine, Pickering (CA)

(73) Assignee: Celestica International Inc., Toronto (CA)

(*) Notice: Subject to any disclaimer, the term of this patent is extended or adjusted under 35 U.S.C. 154(b) by 0 days.

(21) Appl. No.: 09/527,260

(22) Filed: Mar. 17, 2000

(51) Int. Cl.[7] .................................................. H05K 7/20
(52) U.S. Cl. ........................ 361/704; 361/707; 361/709; 361/710; 361/719; 361/720; 174/16.3; 165/80.1; 165/185
(58) Field of Search ..................................... 361/703, 704, 361/707, 709, 710, 712, 717–720, 722; 257/706, 707, 718, 719, 722; 174/16.3; 165/80.2, 80.3, 185

(56) References Cited

U.S. PATENT DOCUMENTS

| | | | | |
|---|---|---|---|---|
| 5,291,063 | * | 3/1994 | Adishian | 257/712 |
| 5,459,639 | * | 10/1995 | Izumi | 361/707 |
| 5,875,097 | * | 2/1999 | Amaro et al. | 361/704 |
| 5,909,358 | * | 6/1999 | Bradt | 361/707 |
| 5,949,648 | * | 9/1999 | Liao | 361/700 |
| 6,005,773 | * | 12/1999 | Rozman et al. | 361/707 |
| 6,034,874 | * | 3/2000 | Watanabe | 361/704 |

* cited by examiner

Primary Examiner—Leo P. Picard
Assistant Examiner—Boris L. Chervinsky
(74) Attorney, Agent, or Firm—Blake, Cassels & Graydon LLP

(57) ABSTRACT

A Printed Circuit Board (PCB) has a cut-out that permits a monolithic copper or aluminum heatsink to be mounted flush with the surface of the PCB. Electrical devices can be mounted to the monolithic heat sink. The heat sink is bent to extend out of the plane of the PCB. The heatsink can have parts mounted to connect with either face of the PCB, and can extend from either side of the PCB. The heatsink is stepped to present one surface flush with the PCB and another surface that lies along the face of the PCB.

43 Claims, 9 Drawing Sheets

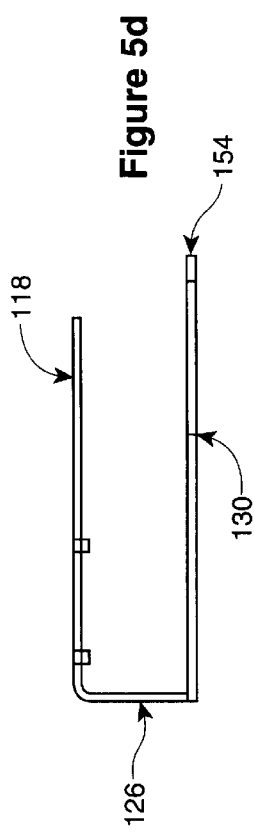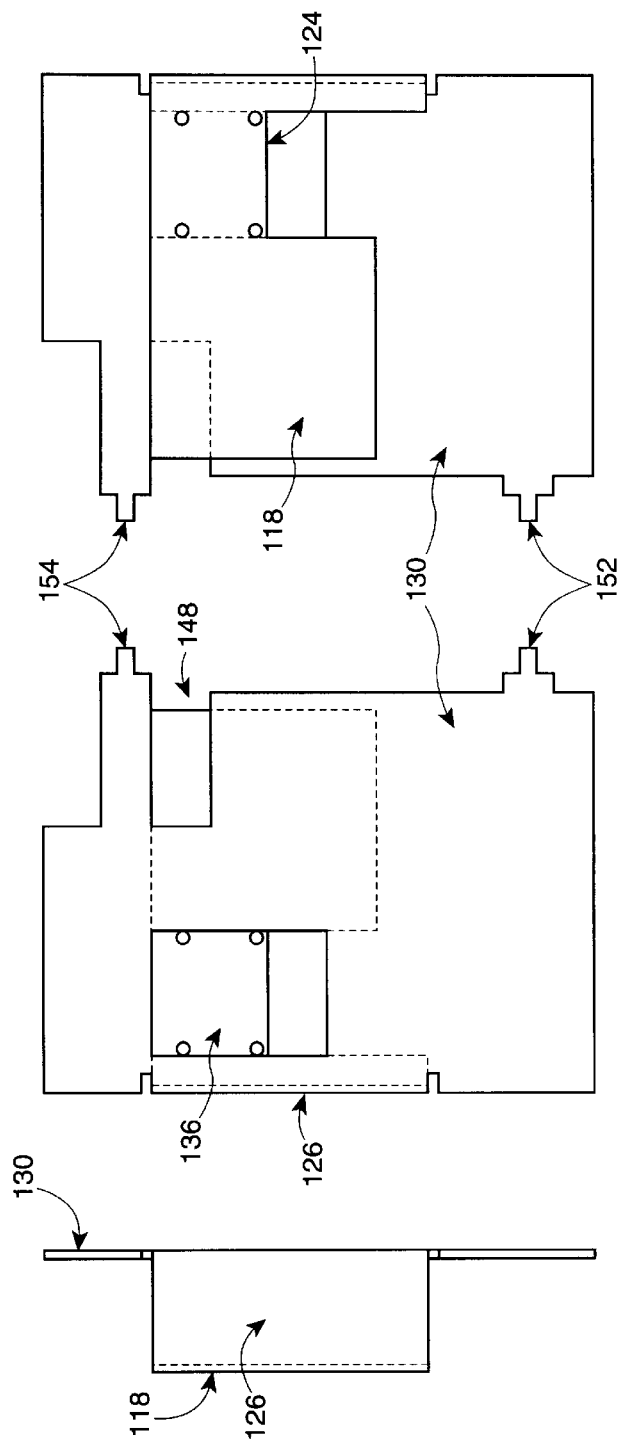

POWER HEATSINK FOR A CIRCUIT BOARD

FIELD OF INVENTION

This invention relates to the field of surface mounted elements for printed circuit boards.

BACKGROUND OF THE INVENTION

The removal of heat from devices mounted to a printed circuit board (PCB) has presented ongoing challenges for designers, especially in the design of cards which function as power supply boards, since device reliability decreases as device temperature increases. Devices used for power conversion, such as power diodes and power switching devices, tend to require relatively effective heatsinks to achieve adequate function and reliability. A traditional approach is to attach pin through-hole (PTH) power devices by any of several means to a heat sink, and to place this assembly onto the PCB for wave soldering. This approach requires a significant amount of hand assembly plus a wave soldering process (for PTH part attachment to the PCB), typically in addition to an existing reflow process if surface mount components are used. Such a process may tend to be relatively costly.

An alternative process has been to use surface mount (SMT) power devices which eliminate the wave soldering process and which permit automation of the assembly operation. This approach is limited by the ability of the PCB copper planes to remove heat from the various power devices.

It is also possible to bond the underside of the casing of a power device directly to the surface of the circuit board. A copper layer can be exposed under the device, so that the copper is effectively bonded to the casing. The copper may be conductively linked to adjacent pads, and heatsinks can be soldered to the adjacent pads. The heat is thus able to flow from the device into the copper plane, and thence along the board to the heatsink whence it is carried away by convection inside the electronic device enclosure. There may be two disadvantages to this approach. First, the heat conduction is limited to the cross-sectional area of the copper path between the device and the adjacent heatsink. The width of that path is limited, since not all of the width of the board can be devoted to carrying heat. In the other cross-sectional dimension, the thickness of the copper plane is very limited, a 2 oz., standard thickness layer being only 0.0028" thick. Second, the heat must cross not one, but two solder paste, or conductive, adhesive interfaces. These interfaces are not always good conductors, and are not always well and uniformly made. It would be advantageous to be able to use a much thicker piece of conductive material, whether copper, aluminium or some other medium, and to reduce the number of adhesive interruptions in the heat conduction path.

In the case of a surface mounted device, it may be desirable to provide a heatsink that permits the device to locate flush with the printed circuit board, as if it were sitting on the PCB rather than on top of a heatsink. This may be advantageous where the device has a pre-defined footprint that assumes a flush mounting. It is also of some importance that a pick-and-place machine be able to manipulate the heatsink relatively easily, and that the heatsink and the device to be mounted on it both be in a configuration to accept soldering in an oven.

It often occurs that relatively high heat generation devices, such as transformers with ferro-magnetic cores, are also relatively heavy, as are some heatsinks. This may lead to shock and vibration challenges in a card and rack assembly. In that light, it would be helpful in those circumstances to adopt a type of heatsink that can also assist in the structural stabilization of the printed circuit board. Alternatively, or additionally, it could be helpful for the heat sink to double as a path for the conduction of heat and as an electrically conductive power or ground plane of the printed circuit board.

A power supply card may employ a single turn winding about a core to yield a relatively high current, low voltage signal. In such instances it may be desirable to provide a conductor of large cross-sectional area. It may be preferable to employ a surface mounted monolith of formed copper sheet, for example, to yield the desired path. Use of a conductive surface mounted part also requires care in maintaining creepage distances between the conductive secondary element and neighbouring primary elements on the board. A creepage distance is the isolation distance along a surface between primary and secondary circuitry. The permissible vertical clearance distance is 4 mm, whereas the permissible creepage distance along the surface of a card is 8 mm, as required to meet the reinforced isolation requirement of UL950 for 400 vdc primary voltage. In some instances then, lifting the copper from the board surface may permit a tighter clearance distance to be used, and may tend not to occupy as large a footprint on the board itself

SUMMARY OF THE INVENTION

In an aspect of the invention, there is a heatsink for cooling an electronic deice on a printed circuit board (PCB). The heatsink comprises:

a first attachment interface attachable to a mounting surface of the electronic device, the first attachment interface located on a heatsink portion formed to fit with an accommodation in the printed circuit board;

a second attachment interface attachable to the printed circuit board; and a member extending away from the first interface.

In an additional feature of the aspect, the heatsink is electrically conductive.

In an additional feature of the aspect, the heatsink has an anchoring foot formed for attachment to a structure located aside from the printed circuit board.

In an additional feature of the aspect, the heatsink further comprises a card extraction tab.

In an additional feature of the aspect, the heatsink further comprises a first portion oriented to extend outwardly from the plane of the printed circuit board.

In an additional feature of the aspect, the member includes a first portion extending outwardly from the printed circuit board, and a second portion extending generally laterally from the first portion and separated from the PCB by a gap, In an additional feature of the aspect, the member includes a riser extending outwardly from the PCB and a leg extending from the riser generally parallel to, and spaced from, the plane of the PCB. In a further additional aspect, the heatsink comprises first and second sections in a parallel, spaced relationship and a third section connecting the first section to the second section.

In an additional feature of the aspect, a top member extends outwardly from the member. In a further additional aspect, the top member has an allowance defined therein allowing introduction of the device therethrough.

In an additional feature of the aspect, the heatsink has a power device mounted thereon, the power device having leads extending therefrom, the leads being mountable to contacts on the printed circuit board.

In a second aspect, a heatsink for cooling an electronic device on a printed circuit board is provided. The heatsink comprises
- a first attachment interface attachable to a mounting surface of the electronic device, the first attachment interface located on a heatsink portion formed to fit with an accommodation in the printed circuit board; and
- a second attachment interface attachable to the printed circuit board.

The first and second attachment interfaces are located on opposite sides of the heatsink.

In an additional feature of the aspect, the heatsink is chosen from the set of heatsinks consisting of heatsinks wherein:
- (a) the heatsnk has the first attachment interface extending tough the accommodation;
- (b) the heatsink has the first attachment interface extending part way into the accommodation; and
- (c) the heatsink has first attachment interface exposed by the accommodation.

In an additional feature of the aspect, the first attachment interface extends through the accommodation and the first attachment interface is chosen from the set of attachment interfaces consisting of
- (a) an attachment interface flush with a surface of the PCB; and
- (b) an attachment interface extending at least partially above the surface of the PCB.

In an additional feature of the aspect, the heatsink has a stepped portion located to lie in the accommodation, In an additional feature of the aspect, the stepped portion has the first attachment interface located to lie flush with a surface of the PCB.

In a third aspect of the invention, a printed circuit board assembly is provided. The assembly comprises:
- a printed circuit board (PCB) having a first and second surfaces and an opening in the PCB, the opening spanning from the first surface to the second surface;
- a heatsink comprising a first portion being attachable to the first surface, a leg extending through the opening and a casing seat portion extending from the leg, the casing seat portion being attachable to the second surface; and
- an electrical device having a casing mounted to the casing seat portion of the heatink.

In an additional feature of the aspect, the assembly is chosen from the set of assemblies consisting of assemblies wherein:
- (a) the heatsink has a casing scat portion extending through the opening and the casing is mounted to the casing scat portion;
- (b) the heatsink has a casing seat portion extending part way into the opening and the casing is mounted to the casing seat portion; and
- (c) the heatsink hu a casing seat portion exposed by the opening and the casing scat portion is mounted though the opening.

In an additional feature of the aspect, the heatsink has a casing seat portion that extends through the opening and the casing is mounted to the cuing seat portion on an interface chosen from the set of interfaces consisting of
- (a) an interface flush with the second surface of the PCB; and
- (b) an interface extending at least partially above the second surface of the PCB.

In an additional feature of the aspect, the heatsink has a casing scat portion that extends part way tough the opening and the casing is mounted to the casing seat on an interface lying between the first and second surfaces of the PCB.

In an additional feature of the aspect, the heatsink has a casing seat portion lying flush with the first surface of the PCB and the cuing is located at least partially in the opening and is mounted to the casing seat.

In an additional feature of the aspect, the heatsink has a stepped portion located to lie in the opening.

In an additional feature of the aspect, the stepped portion has a casing seat located to lie flush with the second surface of the PCB. In a further additional feature of the aspect, the first and second surfaces of the PCB arm substantially planar and parallel. Also, the heatsink has a land mounted to the first surface of the PCB and lying in the plane of the first surface; the heatsink has a casing scat lying in a plane parallel to the plane of first surface; and the casing is mounted to the casing seat.

In an additional feature of the aspect, the heatsink has a leg extending through the relief and a casing seat portion extending from the leg and lying along second surface of the PCB and the casing is mounted to the casing seat portion.

In an additional feature of the aspect, the heatsink has a member standing outwardly from the first surface of the PCB. In a further additional aspect, the heatsink has a leg extending outwardly from the first surface of the PCB; the leg has a distal end; and the heatsink has a wing extending from the distal end in spaced relationship from the fist surface of the PCB. In a still further additional aspect, one surface of the PCB is substantially planar, and the wing has a support foot for mating with an adjacent structure located out of the plane of the first surface of the PCB.

In an additional feature of the aspect, another electrical device has a casing mounted to the heatsink and the other electrical device has at least one electrical contact connected to the first surface of the PCB.

In an additional feature of the aspect, the opening is selected from the set of openings consisting of
- (a) an aperture having a continuous closed periphery let through the body of the PCB;
- (b) a rabbet extending inwardly from an edge of the PCB; and
- (c) a rabbet formed at a comer of the PCB; and first and second surfaces of the PCB are substantially planar and mutually parallel, Also, the heatsink has at least one substantially planar footing for mounting to the first surface and the heatsink has a stepped portion adjoining the footing. The stepped portion is located to extend through the relief and has a substantially planar casing seat lying flush with the second surface. The second surface has an electrical contact footprint adjacent to the relief. The casing is mounted to the casing seat and the contact is connected to the footprint. Also, the heatsink has a leg connected to the land portion, the leg extending substantially perpendicularly away from the one surface of the PCB and having a distal end and has a wing extending from the distal end of the leg substantially parallel to, and spaced from the first surface of the PCB. The wing has a support foot for mating with a mounting socket, the foot lying out of the plane of the first surface.

In a fourth aspect of the invention, a printed circuit board assembly is provided. The assembly comprises:
- a printed circuit board (PCB) having a surface, the surface having and an accommodation to fit with a component;
- a heatsink comprising a first attachment interface attachable to a mounting surface of the electronic device, the first attachment interface located on a heatsink portion formed to seat within the recess of the PCB;

a second attachment interface attachable to the printed circuit board; and a member extending away from the first attachment interface; and an electrical device having a casing and at least one electrical contact, the electrical contact being mounted to the second surface, the casing being mounted to the heatsink.

In an additional feature of the aspect, the heatsink is electrically conductive.

In an additional feature of the aspect, the heatsink has an anchoring foot formed for attachment to a structure located aside from the printed circuit board.

In an additional feature of the aspect, the heatsink further comprises a card extraction tab.

In an additional feature of the aspect, the heatsink further comprises a first portion oriented to extend outwardly from the plane of the printed circuit board.

In an additional feature of the aspect, the member includes a first portion extending outwardly from the printed circuit board, and a second portion extending generally laterally from the first portion and separated from the PCB by a gap.

In other aspects, the invention provides various combinations and subsets of the aspects described above.

In another aspect of the invention, there is a printed circuit board. The printed circuit board has a pair of faces. A heatsink is mounted to one of the faces. The electrical device has a casing and at least one electrical contact. The electrical contact is mounted to the other face of the PCB. There is a relief defined in the PCB to permit the casing to be mounted to the heatsink. The casing is mounted to the heatsink.

In an additional feature of that aspect of the invention, the assembly is chosen from the set of assemblies consisting of assemblies wherein the heatsink has a casing seat portion extending through the relief. The casing is mounted to the casing seat portion. The heatsink has a casing seat portion extending part way into the relief and the casing is mounted to the casing seat portion. The heatsink has a casing seat portion exposed by the relief and the heatsink is mounted to the casing seat portion through the relief.

In another additional feature of that aspect of the invention, the heatsink has a casing seat portion that extends through the relief and the casing is mounted to the casing seat portion on an interface chosen from the set of interfaces consisting of an interface flush with the other face of the PCB and an interface at least partially proud of the other face of the PCB. In a further additional feature, the heatsink has a casing seat portion that extends part way through the relief and the casing is mounted to the casing seat on an interface lying between the faces of the PCB. In yet another additional feature of that aspect of the invention, the heatsink has a casing seat portion lying flush with the one face of the PCB and the casing is located at least partially in the relief and is mounted to the casing seat.

In still another additional feature of that aspect of the invention, the casing and the heatsink form part of an electrically conductive path. In another additional feature, the heatsink constitutes a voltage plane. In another additional feature, the voltage plane is a ground plane. In yet another additional feature, the heatsink has an electrical contact pin for locating in a socket of installation of the assembly in a computer.

In still another additional feature of that aspect of the invention, the heatsink has a stepped portion located to lie in the relief. In another additional feature, the stepped portion has a casing seat located to lie flush with the other face of the PCB. In still yet another feature, the faces of the PCB are substantially planar and parallel. The heatsink has a land mounted to the one face of the PCB, the land lying in the plane of the one face. The heatsink has a casing seat lying in a plane parallel to the plane of the one face. The casing is mounted to the casing seat. In another additional feature, the heatsink has a leg extending through the relief and a casing seat portion extending from the leg and lying along the other face of the PCB. The casing is mounted to the casing seat portion. In yet another additional feature, the relief has, in plan view, a form chosen from the set of shapes consisting of (a) the shape of the casing in plan view; (b) a square; (c) a rectangle; (d) a circle; (e) a semicircle; (f) a rabbet let into an edge of the PCB; and (g) a rabbet let into a corner of the PCB.

In still another additional feature of that aspect of the invention, the heatsink has a member standing outwardly from the one face of the PCB. In an additional feature, the heatsink has a leg extending outwardly from the one face of the PCB. The leg has a distal end. The heatsink has a wing extending from the distal end in spaced relationship from the one face of the PCB. In another additional feature, the one face of the PCB is substantially planar, and the wing has a support foot for mating with an adjacent structure located out of the plane of the one face of the PCB. In a further additional feature, the heatsink is electrically conductive and the foot is shaped for engagement with an electrically conductive socket. In a still further feature, another electrical device has a casing mounted to the heatsink and the other electrical device has at least one electrical contact connected to the one face of the PCB.

In another aspect of the invention, there is a method of assembling a printed circuit board assembly. The method has the steps of obtaining a printed circuit board having a face upon which to mount electrical devices, an electrical contact array, and a relief let therein for accommodating a heatsink. It also includes the steps of preparing a connection interface of the printed circuit board for receiving the heatsink and placing the heatsink on the printed circuit board in a position in which at least a portion of the heatsink lies in the relief. Further steps are placing a heat producing electrical device on the heatsink, attaching the heat producing device to the heatsink and connecting the heat producing device to the electrical contact array.

In an additional feature of that aspect of the invention, the step of preparing includes a step chosen from the set of steps consisting of (a) screening solder past onto the face of the printed circuit board; and (b) locating solder performs on the printed circuit board.

In another aspect of the invention, there is a method of assembling a printed circuit board assembly. The method has the steps of obtaining a printed circuit board having a face upon which to mount electrical devices, and an electrical contact array, the printed circuit board having a relief formed therein to accommodate a heatsink. The method includes preparing a connection interface of the printed circuit board for receiving the heatsink, placing the heatsink on the printed circuit board in a position in which at least a portion of the heatsink lies in the relief, placing a heat producing electrical device on the heatsink, and attaching the heat producing device to the heatsink and connecting the heat producing device to the electrical contact array.

In another aspect of the invention, there is a transformer. There is a first winding formed in an electrically conductive layer of a printed circuit board. There is a second electrically conductive winding mounted in a magnetically coupled position relative to the first winding. At least a portion of the second winding includes an electrically conductive monolith mounted to the printed circuit board.

In an additional feature of that aspect of the invention, the first winding is a multi-turn winding and the transformer is a step down transformer. In another additional feature of that aspect of the invention, the printed circuit board has an opening formed therein, and a magnetic core mounted therethrough. The first and second windings are mounted about the magnetic core. In still another additional feature of that aspect of the invention, the printed circuit board has a face lying parallel to the conductive layer, and the monolith is a metal sheet mounted to the face. In yet another additional feature of that aspect of the invention, the monolith has legs formed therein. The legs are mounted to either side of the core, and a bridge member is formed in the monolith connecting the legs to form a u-shaped path about the core. The legs have toes distant from the bridge member. The toes are connected to an electrical circuit.

BRIEF DESCRIPTION OF DRAWINGS

The principles of the invention are explained below with the aid of the following illustrative Figures:

FIG. 5a is a plan view of the heatsink of FIG. 4.

FIG. 5b is an end view of the heatsink of FIG. 4.

FIG. 5c is a top view of the heatsink of FIG. 4.

FIG. 5d is a bottom view of the heatsink of FIG. 4.

DETAILED DESCRIPTION OF THE INVENTION

Figure 1:
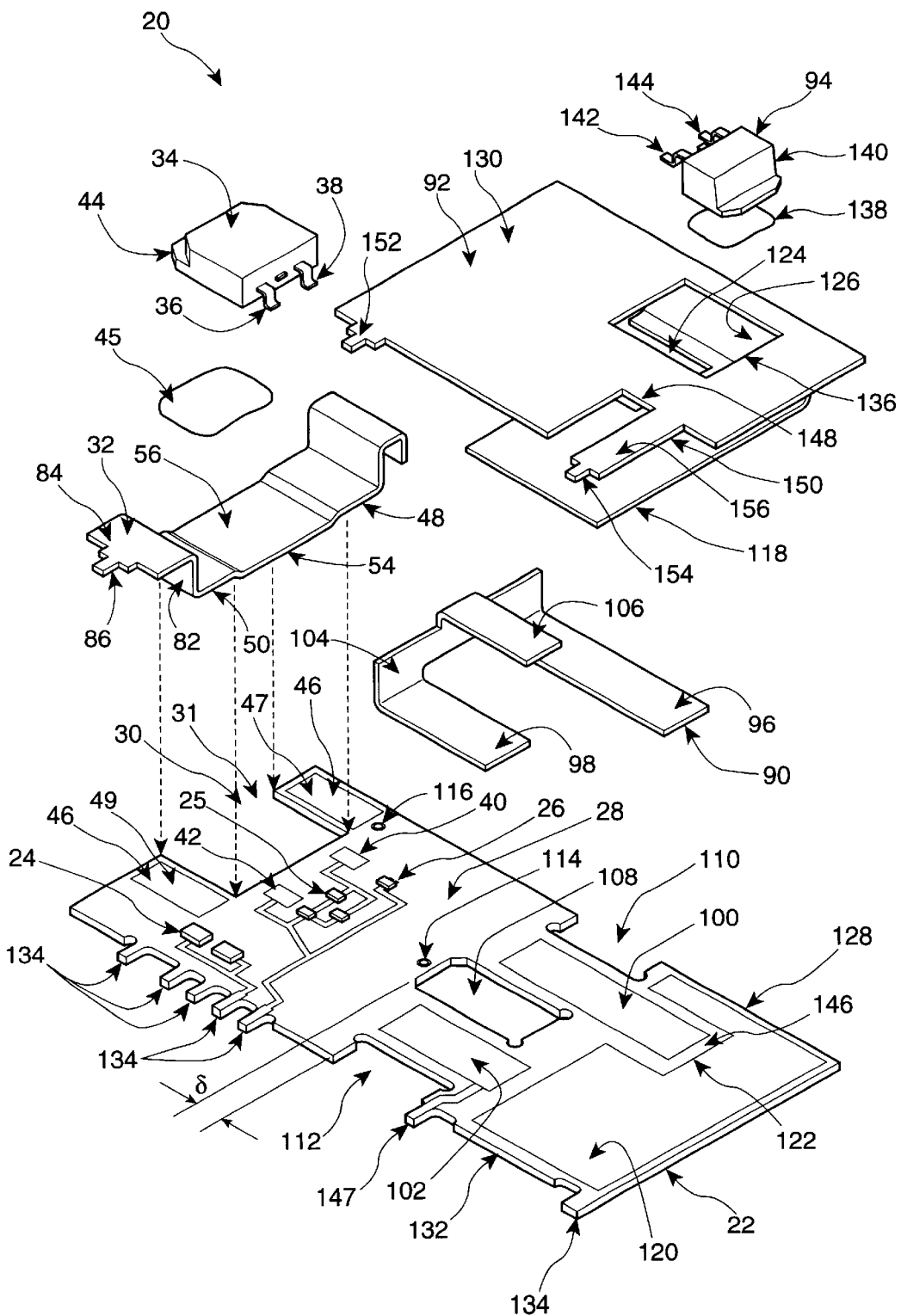
FIG. 1 is a general arrangement, isometric exploded view of a preferred example of a heatsink and printed circuit board assembly according to the principles of the present invention.
Figure 4:
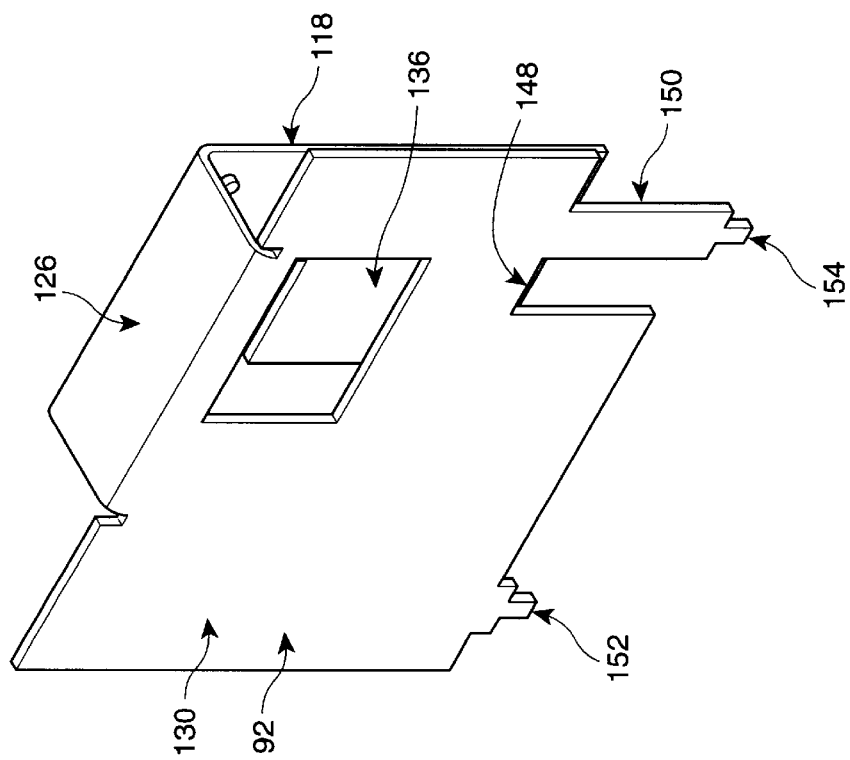
FIG. 4 is a general arrangement, isometric exploded view of another example of a heatsink of FIG. 1.

The description which follows, and the embodiments described therein, are provided by way of illustration of an example, or examples, of particular embodiments of the principles of the present invention. These examples are provided for the purposes of explanation, and not of limitation, of those principles and of the invention. In the description which follows, like parts are marked throughout the specification and the drawings with the same respective reference numerals. The drawings are not necessarily to scale and in some instances proportions may have been exaggerated in order more clearly to depict certain features of the invention.

Commencing with FIG. 1, a printed circuit board and heatsink assembly is shown, in exploded form, generally as 20. A printed circuit board (PCB) is indicated as 22 and has a number of surface mount devices 24, 25, 26 attached at locations on mounting surface 28. PCB 22 and its associated electrical devices, when fully assembled, may be considered to be a power supply. An accommodation, or relief, 30 in the nature of a square cornered, U-shaped opening 31, has been let through the full thickness of PCB 22 to permit a portion of a preferred heatsink 32 made of a thermally conductive material, to seat therein, as described below. PCB 22 has a number of conducting layers and dielectric insulating layers, and footprint formations for connection to electronic devices, in the manner of printed circuit boards generally.

A relatively high power heat producing device in the nature of a D2PAK is indicated as 34. For the purposes of conceptual explanation heat producing device 34 could alternatively be a power switch, an SCR, a power diode, or some analogous electrical device. Heat producing device 34 has electrical contacts 36 and 38 for connection with footprint connections 40 and 42, in the nature of surface mount pads of PCB 22. The casing 44 of heat producing device 34 is mounted with its underside next to heatsink 32. Device 34 is mounted to heatsink 32 at one attachment interface and heatsink 32 is mounted to PCB 22 at another attachment interface. A part of heatsink 32 extends away from the one attachment interface for carrying heat away from device 34. This is described in greater detail below.

The location of attachment between device 34 and heatsink 32, whether through direct contact, solder, or a thermally or electrically conductive paste, defines a first interface. In the preferred embodiment illustrated, a solid solder perform 45 is placed between the two components, and heating results in a solder joint being formed. PCB 22 also has a heatsink footprint array 46. In the preferred embodiment illustrated in FIG. 1, footprint array 46 has a pair of pads, indicated as lands 47 and 49. Stepped board contact wing portions 48 and 50 of heatsink 32 mate with lands 47 and 49 respectively. The mating surfaces or array 46 for contacting PCB 22 define a second interface. During assembly, solder paste is provided for array 46 of PCB 22.

Figure 3A:
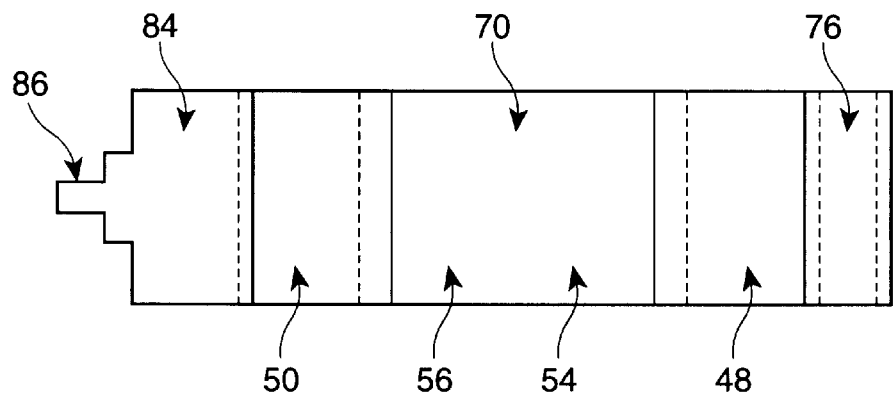
FIG. 3a is a plan view of the heatsink of FIG. 2.
Figure 3B:
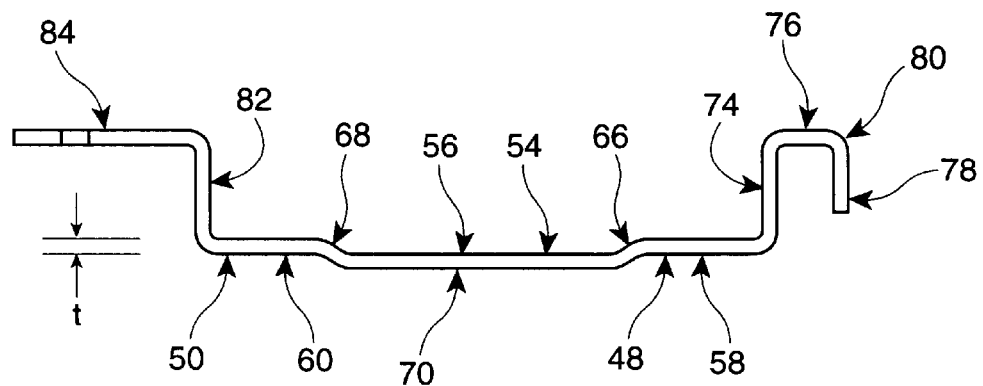
FIG. 3b is a profile view of the heatsink of FIG. 2.

As shown in FIGS. 3a and 3b, heatsink 32 has one face 54, of a central, stepped portion 56. At the second interface, heatsink 32 has faces 58 and 60 of adjacent portions 48 and 50, which face in the opposite direction to face 54. That is, faces 58 and 60 face toward surface 28 of PCB 22 while face 54, faces away from surface 28 of PCB 22 (and toward device 34). The height of steps 66 and 68 is equal to the through thickness 't' of heatsink 32, such that faces 54, 58 and 60, and hence the first and second interfaces, will tend to be co-planar, face 54 lying flush with surface 28 on installation. Thus when the contacts 36 and 38 of device 34 overhang the edge of portion 56, their height placement, relative to surface 28 of PCB 22 will tend to be the same as if they had been mounted on PCB 22 without an underlying heatsink.

Figure 2:
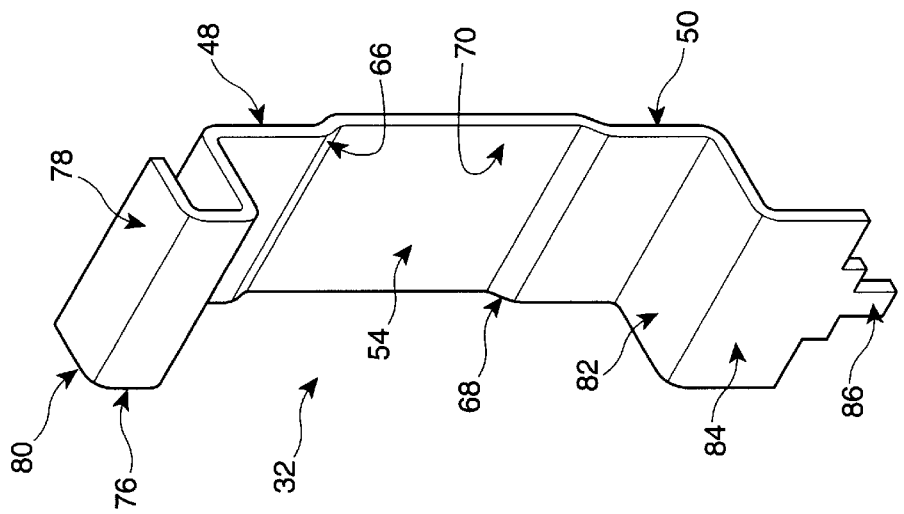
FIG. 2 shows an isometric view of a heatsink of FIG. 1 by itself

As shown in FIGS. 2, 3a and 3b, more closely, heatsink 32 is formed from a monolithic piece of metal 70, whether made from sheet or extruded, but could be extruded aluminium treated with solderable material. In the preferred embodiment, heatsink 32 is made of copper. However, other thermally conductive materials, such as aluminium, nickel, beryllium, molybdenum, iron, steel, or alloys of one or more of them could be used for this or the other embodiments of the invention described below. Heatsink 32 has been formed to yield portion 56 bounded by steps 66 and 68, whence wing portions 48 and 50 extend in a plane for mating with PCB 22. At the distal end of portion 48 a riser 74 is bent at a right angle, to extend away from the printed circuit board in use. Riser 74 terminates in a short leg, or back 76, which in turn gives onto a re-entrant depending leg 78 which extends back toward PCB 22. The channel shape thus formed permits the resultant hooked shape to be engaged as a card extractor bracket 80. The formed shape allows components to be placed on PCB 22 under the raised sections, such as leg 84, of heatsink 32.

At the other end of heatsink 32, another riser 82 extends upwardly from the distal end of portion 50 and terminates in a reverse bend into a leg 84 extending in a plane generally parallel to stepped portion 56. At the furthest end of leg 84 there is a foot 86 having the same shape as a pin for engagement in an electrical socket. Foot 86 can be inserted in a standard electrical socket for the purposes of providing an electrical connection to, for example, a mother board (not shown), or in an electrically dead socket to act as a structural stabilizer. When engaged in an electrically live socket, foot 86 can perform both electrical and structural support functions.

Also shown in FIG. 1 are a single turn secondary winding of a plane transformer, indicated as 90 and a heatsink 92, to which another heat producing device 94, also in the nature of a D2PAK, is mounted. Again, although a D2PAK is used in the preferred embodiment, and is illustrated for the purposes of conceptual explanation, other heat producing electrical devices, such as an SCR, a power diode, a rectifier, a transformer, or a relay could also be used.

Secondary winding 90 has a pair of unequal, generally parallel legs 96 and 98 presenting flat surfaces for mating with solder pad lands 100 and 102 on PCB 22. (Corresponding solder paste pre-forms is used at these locations, but are omitted for clarity). Secondary winding 90 is formed from metal in the nature of a copper sheet, that has been folded 90 degrees upright at one end to yield a laterally extending bridge 104 between legs 96 and 98. Secondary winding 90 could also be formed of electrically conductive materials other than copper, such as aluminum, gold, silver, or platinum. A tongue 106 has been bent a further 90 degrees to extend in a plane spaced from, and substantially parallel to, the plane of legs 96 and 98. In the embodiment illustrated, legs 96 and 98, when soldered to PCB 22, straddle an aperture 108 let through the body of PCB 22. A pair of notches 110 and 112 have been formed in PCB 22 abreast of aperture 108 in a manner to bracket, at least partially, legs 96 and 98 when in place.

In the embodiment illustrated in FIG. 1, one internal layer of copper (not shown) of PCB 22 has been etched to leave a coiled copper track which forms several turns about the periphery of aperture 108. This coiled copper track terminates at a conductive pin in the nature of a through-hole rivet, or via 114 at one end, such as might be connected to a voltage source or voltage plane, and another conductive through-hole rivet, or via 116 at the other end, such as might be connected to a ground plane. A second coiled copper track is formed on a different layer of PCB 22, and is also wound about the periphery of aperture 108. One end of this coil is connected to common ground, the other end is connected to terminal pad footprint connection 40. The circuitry thus described provides two coils of a power transformer. Aperture 108 and notches 110 and 112 provide a mount to which an iron or other ferro-magnetic core can be fastened to PCB 22 to traverse the planes of the layers of PCB 22 having the two coiled copper tracks, thus providing a magnetically permeable flux path for the transformer.

Bridge 104 has been formed upwardly out of the plane of PCB 22 in a manner tending to keep it away from via 114, thus maintaining a desired clearance distance, in the example, 4 mm, without using as large a footprint on the board surface as might otherwise be required. Aperture 108 is larger than required for the central pole of the transformer core, and extends to one side, (the side toward via 114) farther than the corresponding edges of notches 110 and 112, by a distance indicated as $\delta$, that is greater than 1 mm. This extension distance increases the in-plane creepage distance between via 114 and each of lands 100 and 102 to exceed 8 mm, to comply with the applicable standard, IEC-950. Creepage distance is measured along the shortest path available. By making the cut out relatively larger, the creepage path must make a detour, in the form of a dog-leg, thereby increasing its length. Similarly, bridge 104 exceeds the 4 mm vertical clearance distance from via 114. When viewed from a direction normal to the plane of PCB 22, bridge 104 has a horizontal clearance distance from the edge of aperture 108 closest to via 114 that is greater than 1 mm, corresponding to $\delta$.

Tongue 106 of secondary winding 90 extends from bridge 104 and provides a flat engagement surface at the center of gravity of secondary winding 90 as viewed perpendicular to PCB 22. In this way a pick-and-place machine vacuum head can engage the distal portion of tongue 106 at the center of gravity of secondary winding 90, and may tend more easily to manipulate secondary winding 90 than if it were engaged eccentrically, and required a reaction to a moment as well. It should be noted that while secondary winding 90 serves its function as a transformer winding, it also provides an additional, large heat transfer surface area, and, being made of copper sheet, provides a relatively large cross-section for conducting heat away from PCB 22 more generally. As for the purposes of the invention, secondary winding 90 is used also as a heatsink. Hereinafter, secondary winding 90 will be referred to as heatsink 90.

Heatsink 92, shown in FIGS. 4, 5a, 5b, 5c and 5d, has a single large footprint member 118 having a profile to mate with land 120 of PCB 22. A corresponding solder paste pre-form of similar footprint is screened on for assembly, but is not shown for clarity. Land 120 (and hence, correspondingly, footprint member 118) has a generally U-shaped rebate 122 (or 124 for footprint member 118) to accommodate land 100 (and the toe of leg 96). Heatsink 92 is also made from a formed sheet of copper, although other suitable materials as noted above could be used. Heatsink 92 has a back, or riser 126, extending generally parallel to one edge 128, and generally perpendicularly away from surface 28, of PCB 22. The height of riser 126 is greater than the height of bridge 104 and tongue 106. From the furthest edge of riser 126 distant from footprint member 118, a depending member 130 extends in a plane generally parallel to footprint member 118, and generally toward the connector edge 132 of PCB 22, the connector pins being indicated as 134. In as much as riser 126 is of greater height than bridge 104, depending member 130 clears tongue 106. Although the embodiment illustrated in FIG. 1 is preferred, for this type of co-operation between heatsink elements, there are other ways to maintain a clearance between member 130 and tongue 106. For example, tongue 106 could be located at a height that is greater than the height of riser 126, thereby lying in a plane that is further from PCB 22 than depending member 130. Alternatively, tongue 106 could lie in the same plane as member 130 but, in plan view they could be given shapes that fit next to each other with a gap between them.

Depending member 130 has an accommodation in the nature of a rectangular aperture 136. Aperture 136 is of a size to permit an automated placement head (not shown) such as a vacuum placement head, to place heat producing device 94 (typically with a solder perform 138) onto footprint member 118. When so placed, the heat producing device casing 140 rests on the bottom of the 'U' of footprint member 118, with its two electrical contact feet 142 and 144 spanning a gap 146 between heatsink 90 and heatsink 92 to rest on the toe of leg 96 of heatsink 90. In this embodiment, heatsink 92 is electrically live, and is at the secondary output voltage or return potential. Heatsink 90 is also live, at some different voltage. In this instance the high voltage is produced in the turns of the output winding of the transformer described above. A conductive track provides a path from land 102 to pin 147, at which the output voltage may be tapped.

It will be appreciated that when preferred heatsink 32, or any other heatsink referred to herein, is referred to as performing the function of a voltage plane or of a ground plane, in the electrical sense, this does not imply that heatsink 32, or such other heatsink as may be referred to, is necessarily physically planar in the geometric sense. Rather, a voltage or ground "plane", in the electrical sense, is a body, or element, whatever its physical shape, that has a substantially uniform voltage level (a voltage plane) throughout the member.

Depending member 130 is also notched, as at 148 and 150, to accommodate other devices, such as toroidal beads (not shown) for single turn output inductors for achieving output filtering. Depending member 130 may be connected to a mother board, such as multi-pin connector cables or other devices. Depending member 130 also has a pair of pin connector feet 152 and 154, the former extending outward on the connector side edge of the body of depending member 130, and the latter extending outward on the connector side edge at the end of an arm 156. When feet 152 and 154 are mounted in sockets, they act to stabilize the assembly, in the manner of stays or supports.

The surface area of heatsinks 32, 90, and 92 significantly augments the cooling surface area that would otherwise be available to respective heat producing devices 34 and 94. Further, as parts made from monolithic pieces of sheet metal, namely 0.040" thick copper sheet, the cross section for carrying heat away from devices 34 and 94 has a thickness of the order of 10 to 15 times as great as for a 2 oz. deposited copper ground plane or similar layer. When multiplied by the not insignificant width of heatsinks 90, and 92 leading away from the transformer, or from heat producing device 94, the effective cross section for thermal conduction is improved over that which would otherwise be possible with a deposited 2 oz. layer.

Although the enhanced convection and radiation surface areas of the various portions of heatsinks 32, 90, and 92 are shown as flat plate surfaces, with generally square corners, this need not be the case. Portions of the heatsinks, such as those portions of heatsink 32 extending from the end of risers 74 and 82 84, or depending member 130, subject to space restraints, could be more elaborately finned or corrugated.

Aperture 136 need not be rectangular, but could be replaced by a triangular, trapezoidal, circular, semi-circular, hexagonal or other shaped opening, rabbet or notch suited to the profile to the heat producing device to be inserted therethrough for placement on PCB 22 below, or on one of the heat-spreading plates, such as the copper plate of footprint member 118 or leg 96 of heatsink 90. If the heat producing device is to be located near the edge of the PCB, then an accommodation need not have a closed periphery, like a rectangle, but may be a bight, a relief, or rebate along the edge of a cooling plate such as U-shaped opening 31. The shape of the opening, or allowance, made to accommodate placement of a part will also reflect the operating envelope required by the pick and place machine used to position components on the circuit board assembly, be it a vacuum placement machine or some other type of automated placement machine, or, alternatively, the space required for a part to be placed manually with tweezers. It is preferred to use an automated placement system.

Relief 30 need not be U-shaped, square or rectangular, but could be circular, hexagonal, semicircular, or of some other shape chosen to suit a particular need. The shape chosen need not have sharp corners, but could be chamfered or radiuses to facilitate manufacturing or to reduce stress concentrations. Further, relief 30 need not extend through the full through thickness of the printed circuit board. That is, the printed circuit board could have a hollow of a depth chosen to accommodate the thickness of the heatsink.

Figure 9:
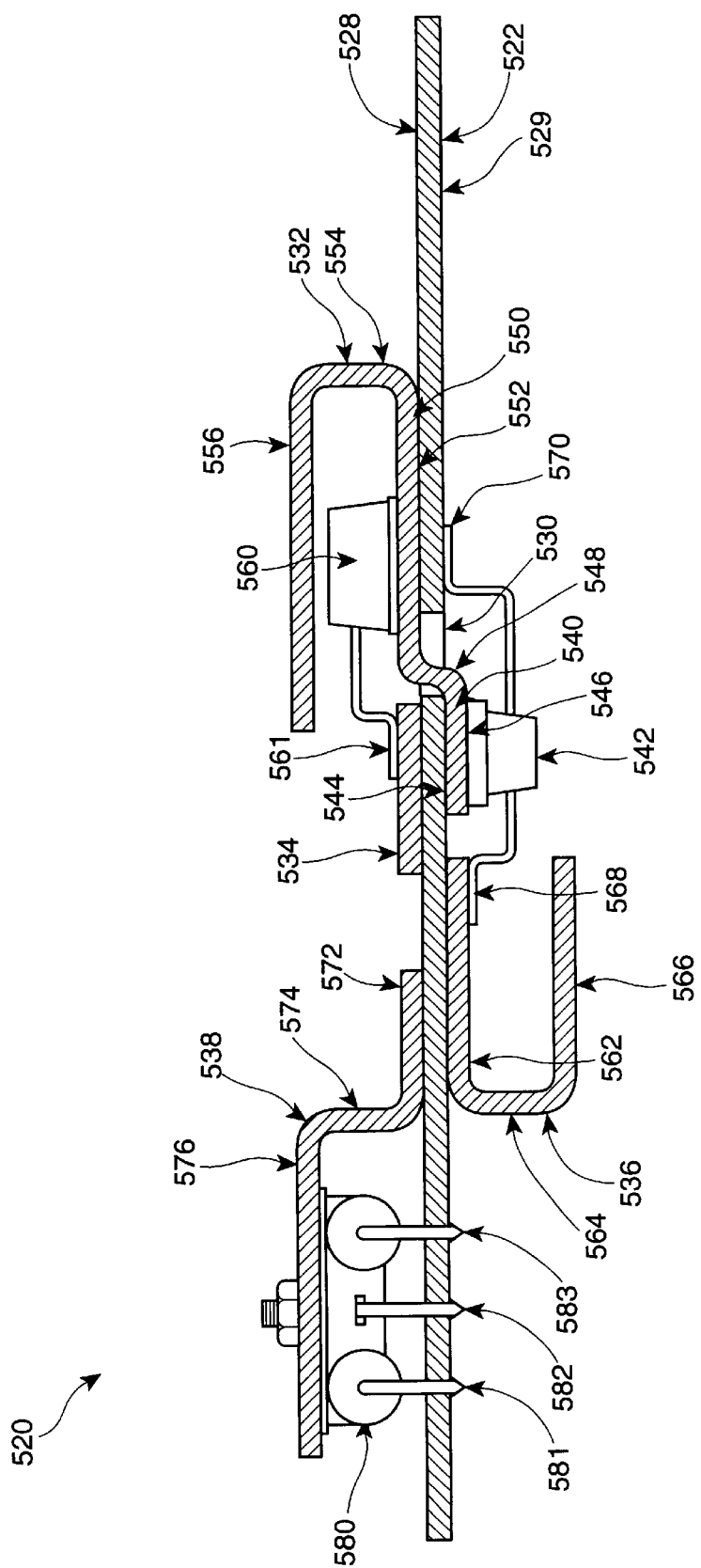
FIG. 9 shows a cross-section of an alternative printed circuit board assembly to those of FIGS. 1, 6, and 7.

In alternative embodiments, the footprint array 46 corresponding to heatsink 32 may have only a single contact point, or several. Array 46 steadies and locates heatsink 32, and provides the structural interface through which normal and shear forces can be carried into heatsink 32 when it performs a steadying structural role. In the case where array 46 includes more than one board contact portion, and relief 30 is a through hole opening, such as U-shaped opening 31, it is possible, subject to the practicalities of placing the part in position relative to PCB 22, that one contact portion could engage one face plane, such as surface 28 of PCB 22, and another portion could be mounted to the other, or rearward face of PCB 22. Such an example is shown in FIG. 9 and described below.

Although it is anticipated that at least one of the contact points of the heatsink will be either a voltage plane or a ground plane, such that heatsink 32 is potentially "live" as in the preferred embodiment described above, this need not be the case. Heatsink 32 could be bonded with rivets, screws, epoxy, or other suitable adhesive or agent to the glass fibre of PCB 22, forming a purely structural (that is, non-electrically conductive) bond. Further, array 46 could include a pattern of pads. The pads need not be symmetrical, or symmetrically placed relative to relief 30.

The assembly process for the preferred embodiment illustrated in FIG. 1 is as follows. First, the status of the various components must be established. That is, PCB 22 is provided, having relief 30 defined therein, appropriate heatsink fastening provisions, such as array 46 provided, and also with suitable electrical contacts provided, such as footprint connections 40 and 42, and pins 134. It also includes obtaining, or providing, heat producing devices for interconnection with the circuitry of PCB 22. Similarly, the step of establishing includes providing a heatsink, such as heatsink 32, or a combination of heatsinks, such as heatsinks 90 and 92, suited for co-operation with the heat producing device or devices.

The step of providing suitable heatsinks may include the step of forming structural (and possibly also electrical)

mounting features, such as feet 86, 152 and 154, for out-of-plane connection with a cold rail or other mating structural mounting, such as a socket. As above, the thickness of the PCB is generally at least one, if not two, orders of magnitude smaller than its length and breadth, such that although it has a finite depth, it may be conceptually idealised as lying in a plane. In that context, the term out-of-plane is taken to refer to connections made to either side of the plane defined by the length and breadth of the PCB.

Once the step of establishing or obtaining the elements to be assembled has occurred, provision is made for joining the devices to the PCB. This step can involve mechanical bonding with fasteners, bonding with bonding agents, glues, epoxies, or soldering. Soldering may be preceded either by the step of screening solder paste onto the top face (the designation of top and bottom is arbitrary), or by placement of solder-pre-forms at the locations at which a bonding interface is to be made between designated devices, or heatsinks, and the PCB.

Electrical devices and heatsinks are placed on the PCB at their appropriate locations. The step of placing the elements is preferably done by a pick-and-place machine, such as a vacuum placement machine. The step of placing the devices and heatsinks is followed by the step of heating the assembly, typically in an oven, to cause the solder paste to reflow, by which structural and electrical connections are made between the various elements and the PCB.

The step of placing elements, whether electrical devices or heatsinks, on the PCB may include the step of first placing heatsinks on the PCB and then placing heat producing devices on the heatsink, or heatsinks. This step may itself include the step of placing solder pre-forms or thermally conductive epoxy on the heatsink before the placement of the devices. Further still, the step of placing, or locating, heat producing devices on device seats on respective heatsinks may include the step of introducing those heat producing devices through allowances in the heatsink (or heatsinks), such as aperture 136, in a direction generally perpendicular to the PCB face (such as face 28).

The step of locating may also include the step of locating heat producing devices on casing seats on both sides of the heatsink (or heatsinks). In the case of soldering by heating in an oven, additional jigs may be required to achieve placement of surface mount devices on both faces of a PCB, or both faces of a heatsink mounted to the PCB.

Yet further still, as in the case of the embodiment of FIG. 9, the method may include the step of locating the heatsink to overhang (in the case of a cantilever, such as heatsink 538 or a simply supported span) or to overspan (in the case of any kind of bridge member) a portion of the PCB, and the step of connecting contact leads from the heat producing device with contacts on the PCB.

In each case the method may further include the step of establishing an electrical connection between the heatsink and the PCB or between the heatsink and the heat producing device, or both.

Figure 6:
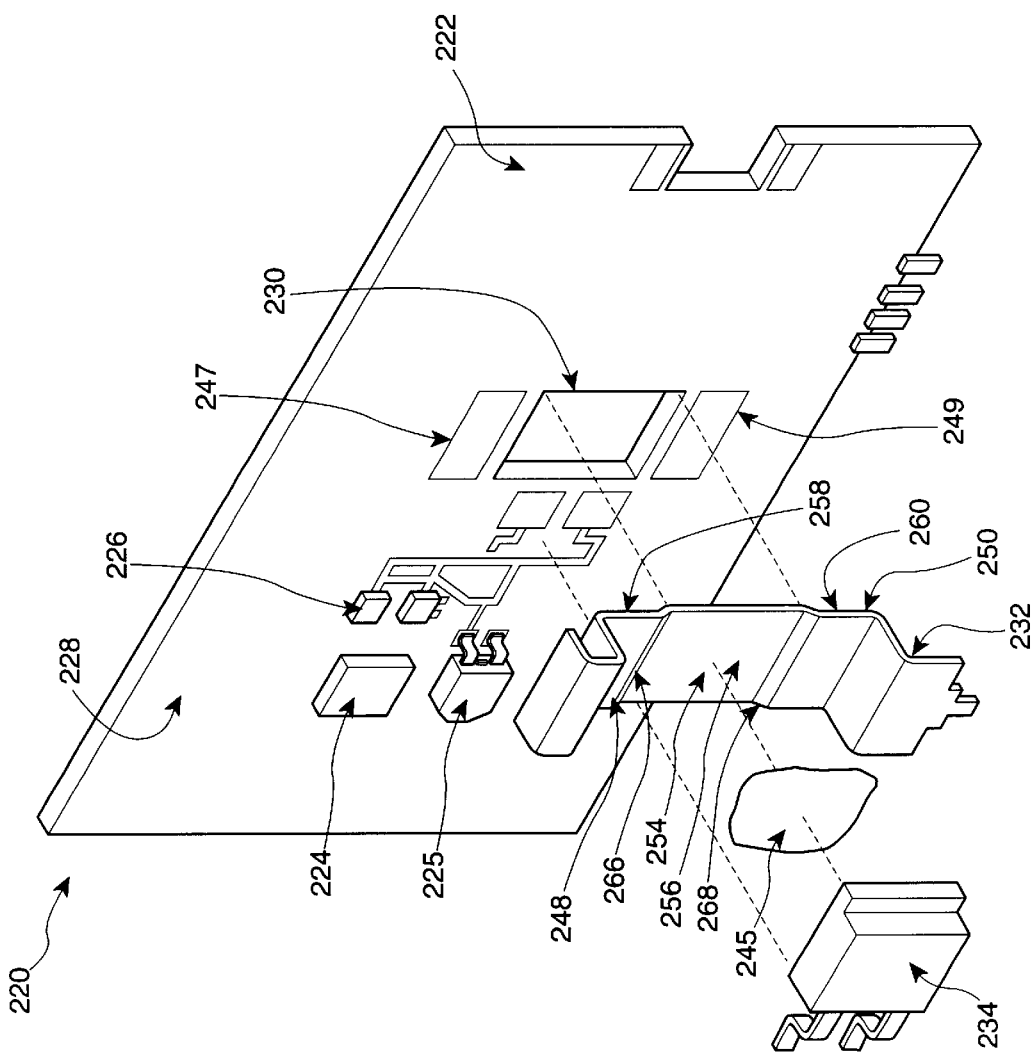
FIG. 6 shows an alternative heatsink and printed circuit board assembly to that shown in FIG. 1.

Another, alternative, embodiment of the present invention is shown in FIG. 6. A PCB and heatsink assembly 220 has a PCB 222. Various surface mount devices 224, 225, and 226 are mounted to one surface 228 of PCB 222. An accommodation, or relief in the nature of a square cornered rectangular opening 230 has been let through (that is formed in) the full thickness of PCB 222 to accommodate a heatsink 232. Opening 230, can be let through PCB 222 either when PCB 222 is formed, or can be drilled, stamped, or sawn out afterward. (This applies also to the formation of U-shaped opening 31 and aperture 108, and notches 110 and 112, noted above).

In the embodiment of FIG. 6, for the purposes of illustration, heatsink 232 is identical in description to heatsink 32 described above, although, in the more general case it need not be. A heat producing device 234 is attached to heatsink 232 by a solder joint formed by melting a solder perform 245 between them. PCB 222 has a pair of solder lands 247 and 249 to which stepped board contact portions 248 and 250, respectively, are mounted. Heatsink 232 has steps 266 and 268 such that the face 254 of the downwardly stepped central portion 256 is substantially coplanar with the surface 228 of PCB 222, and also with the soldered faces 258 and 260 of upwardly stepped board contact portions 248 and 250.

Although opening 230 is rectangular, and has square corners, it could be another shape, and could have rounded or chamfered corners. Further, neither it nor relief 30 need extend fully through PCB 222 or PCB 22, respectively, but could, if of lesser thickness than the aforementioned respective PCBs 22 and 222, be accommodated in a hollow rebate of a corresponding or other depth to yield a desired heatsink surface height, whether flush, shy or proud, relative to the respective PCB surfaces 28 and 228. In an alternative embodiment a relief can be formed at one of the corners of a PCB, either by forming a mitred corner or by cutting, for example, a square sided notch at the corner.

Figure 7:
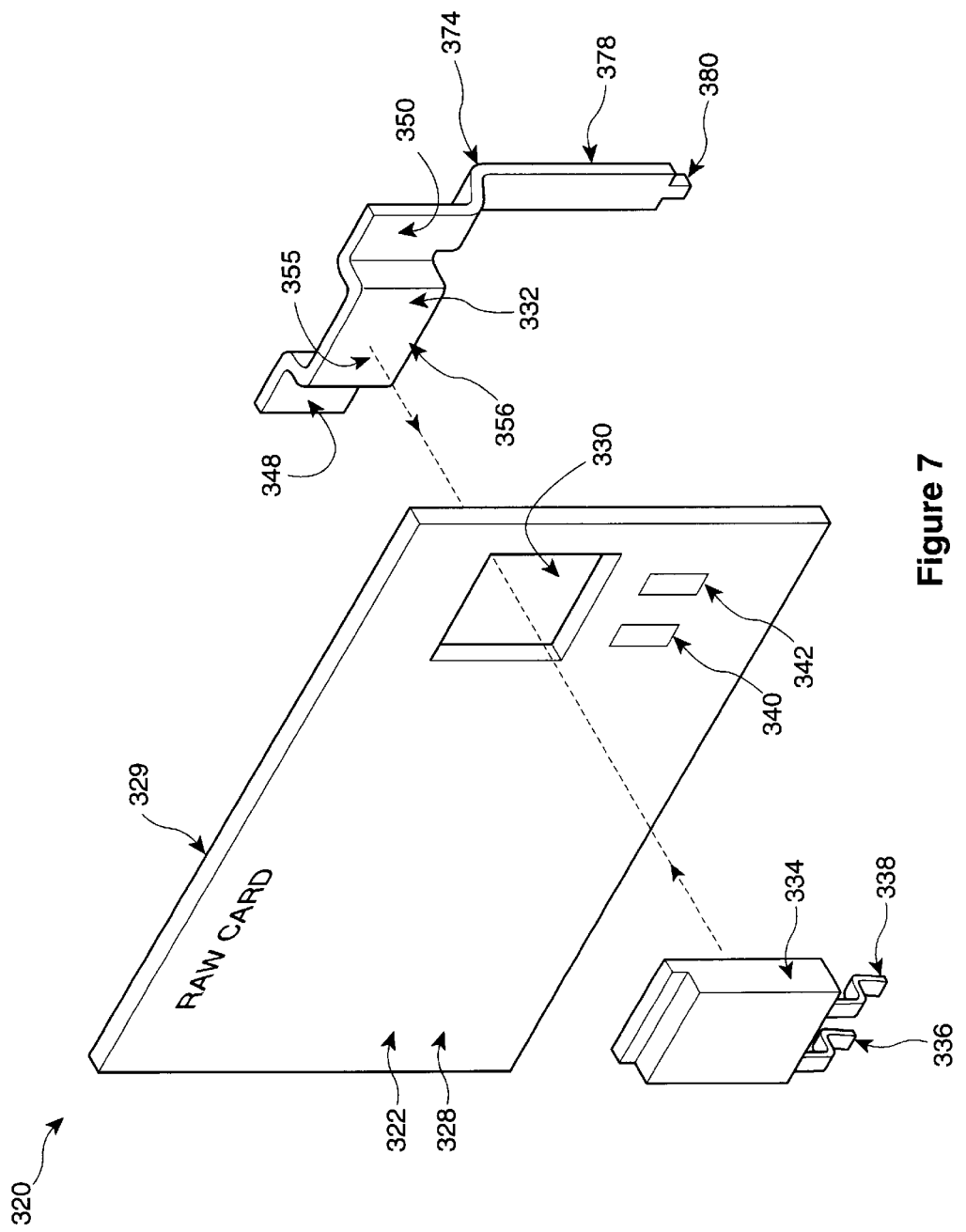
FIG. 7 shows another alternative heatsink and printed circuit board assembly to that of FIG. 1 and having a heatsink extending rearwardly from the printed circuit board.

In a further embodiment illustrated in FIG. 7, a PCB and heatsink assembly 320 has a PCB 322 having a front face 328, and a rear face 329. A relief in the nature of a rectangular through-hole 330 is provided for accommodating a stepped seat portion 356 of a heatsink 332. A heat producing device, in the nature of a D2PAK 334, has its casing 344 mounted to a mounting face 355 of heatsink 332, such that its contact feet 336 and 338 engage solder contact pads 340 and 342 of front face 328 of PCB 322. However, in contrast to the examples recited above, heatsink 332 is introduced from the far, or back side of PCB 322 such that its upwardly stepped wings 348 and 350 mate with solder lands, analogous to lands 47 and 49, on the far, rear face 329 of PCB 322. A dogleg riser 374 is bent outwardly relative to the far side of PCB 322 and has an arm 378 which depends therefrom toward the connector edge of PCB 322. Arm 378 has a foot 380 in the shape of an electrical contact pin for engaging a socket located in a plane offset from the plane of PCB 322, such that arm 378 can act as a stay or strut, or support to stabilize assembly 320, particularly against rotational deflection relative to the connector edge of PCB 322, or translational deflection perpendicular to the plane of PCB 322 generally.

Figure 8:
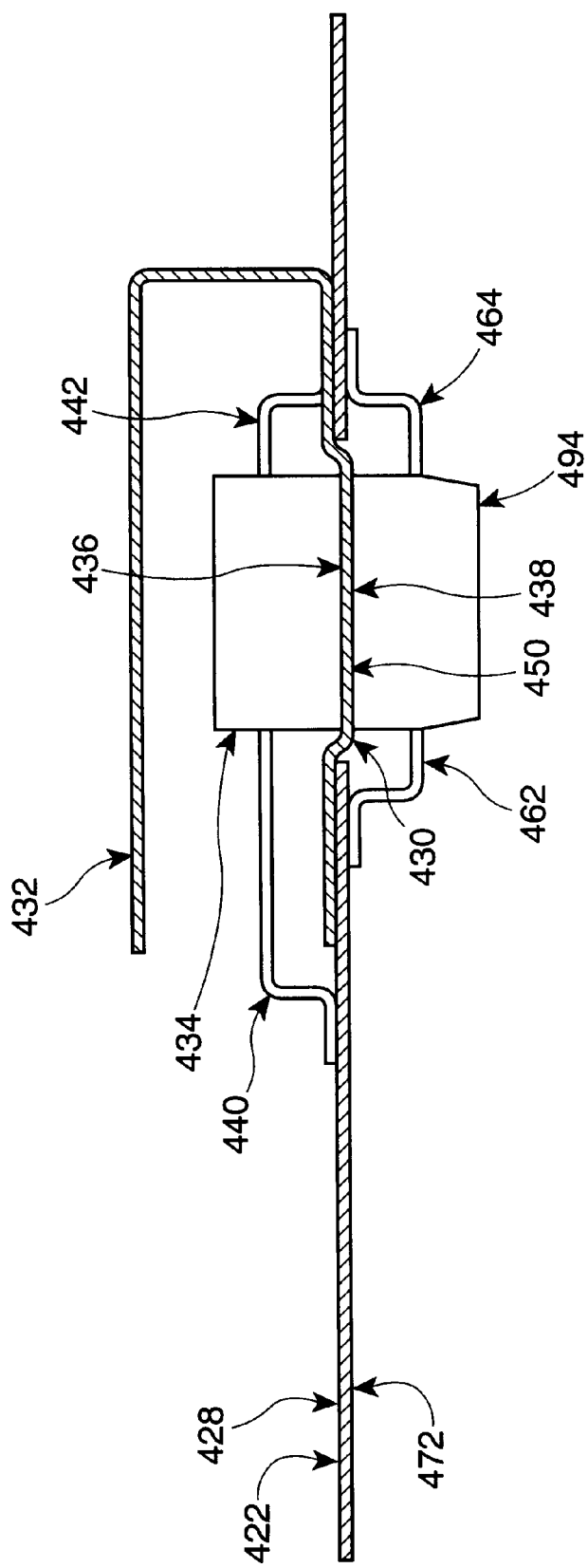
FIG. 8 shows a heatsink and printed circuit board assembly having heat producing devices mounted on both sides of the heatsink.

The embodiment of FIG. 8 shows a cross section of a PCB 422 having a heatsink 432 mounted in a relief 430 therein, with heat producing devices 434 and 494 mounted on opposite faces thereof, one having its contact feet 440 and 442 connected to the front face 428 of PCB 422, the other having its contact feet 462 and 464 mounted to the opposite, or rear face, 472 of PCB 422. In the general case, particularly where heatsink 432 is at a voltage, such as ground, that is common to the casings of two or more heat producing devices, more than one device may be mounted to a common heatsink, and the heat producing devices need not be mounted to the same side of the heatsink, but can be mounted on opposite sides as shown, subject to assembly process requirements.

Figure 10A:
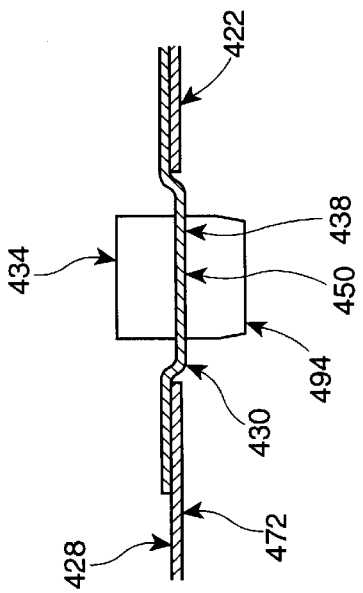
FIG. 10a shows a cross-section of a portion of an alternative printed circuit board assembly to that of FIG. 8.
Figure 10B:
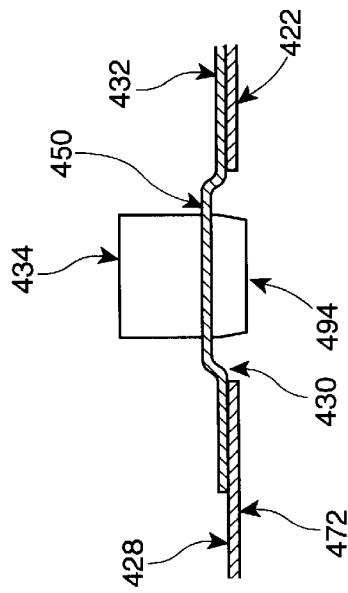
FIG. 10b shows a cross-section of a portion of a second alternative printed circuit board assembly to that of FIG. 8.
Figure 10C:
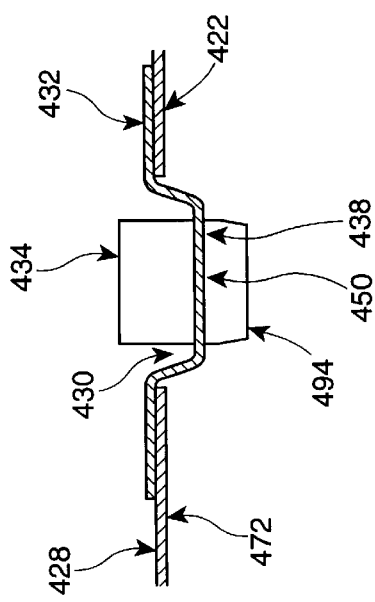
FIG. 10c shows a cross-section of a portion of a third alternative printed circuit board assembly to that of FIG. 8.
Figure 10D:
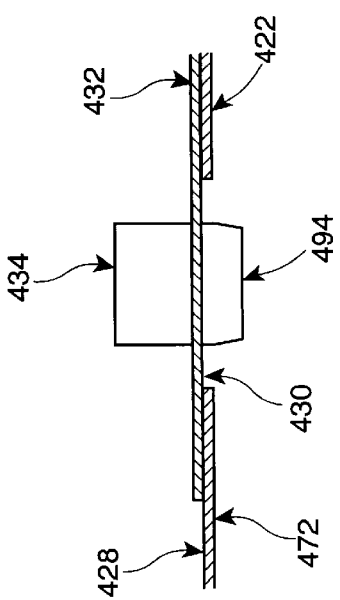
FIG. 10d shows a cross-section of a portion of a fourth alternative printed circuit board assembly to that of FIG. 8.

Also, as may be noted, the portions of heatsink 432, that is, faces 436 and 438 of stepped portion 450, to which devices 434 and 494 are mounted act as casing seats to which the respective casings of devices 434 and 494 are mounted. Although the embodiment shown indicates that face 438 is substantially flush with rear face 472 of PCB 422, this need not be so. Relief 430 is let through PCB 422 to permit device 494 to be mounted to heatsink 432. This can be achieved by having stepped portion 450 extend fully through relief 430, and proud of rear face 472, as shown in FIG. 10a. Alternatively, face 438 can lie flush with face 472, as shown in FIG. 8. In a further alternative shown in FIG. 10b, portion 450 can extend only part way into relief 430 such that face 438 lies shy of face 428. In this alternative, the perimeter of the casing of device 494 is of a shape and size to fall within relief 430. Still further, heatsink 432 need not have a stepped portion, but could have a flat portion extending across relief 430 in the plane of face 428 of PCB 422, such that the casing of device 494 lies flush with face 428, as shown in FIG. 10c. In a still further alternative shown in FIG. 10d, if desired, heatsink 432 could have a stepped portion adjacent relief 430, such that it is exposed by relief 430, with the step extending in the opposite direction, that is, away from face 428 and relief 430, with the casing of device 494 having its base lying partially proud of face 428. In each case the length and shape of feet 462 and 464 are adjusted to suit the depth of the mounting of device 494 relative to relief 430.

It is not necessary that face 438, or 436, be parallel to faces 428 and 472, or that faces 438 and 436 be planar. They could be formed with a non-planar profile, and could be located partly proud, or partly shy, of either of faces 428 and 472.

In the embodiment of FIG. 9, a PCB assembly 520 has a PCB 522 having one face, arbitrarily identified as a front face 528, and another face arbitrarily identified as a rear face 529. A relief 530 is let through PCB 522 to accommodate a heatsink 532. Three other heatsinks, 534, 536, and 538 are also shown. The view of FIG. 9 is a cross sectional view in which the deposited copper conductor layers of PCB 522 have not been shown, and cross-hatching has been omitted from the section of PCB 522 and from heatsinks 532, 534, 536, and 538 for the purposes of clarity.

Heatsink 532 has a foot 540 for insertion through relief 530, whether slid in from one edge of PCB 522, or fed through relief 530 in a complex motion. One face 544 of foot 540 engages rear face 529. A heat producing device 542 is mounted to the opposite face 546, of foot 540. Foot 540 is connected by a crook 548 to a leg 550. Crook 548 is an 'S', or 'Z' shaped bend that extends through relief 530. Leg 550 has a face 552 that lies on surface 528 of PCB 522, and can be electrically, as well as structurally, connected to PCB 522. A riser 554 of heatsink 532 is connected to leg 550 and extends away from PCB 522. At its distal end, a wing member 556 extends substantially parallel to, and in spaced relationship from, surface 528.

Heatsink 534, in the nature of a conduction path, is mounted to surface 528 adjacent to relief 530, and opposite leg 550. A heat producing device 560 has its casing mounted upon leg 550, and a contact foot 561 mounted to heatsink 534.

Heatsink 536 has a channel shaped cross section, with one leg 562 mounted to face 529, a back member 564 acting as a riser, and the other leg 566 acting as a convective heat transfer fin, or wing, extending substantially parallel to, and in spaced relationship from, face 529. Heat producing device 542, mounted to foot 540, has one contact foot 568 shown extending to heatsink 536, and another foot 570 mating with a contact pad on face 529.

Heatsink 538 is a cantilevered suspended heatsink, with a base member 572 mounted to face 528, a riser 574 extending away from face 528, and a hanger bracket 576 extending from the distal end of riser 574 to overhang a portion of face 528. A heat producing device in the nature of a JFET 580 is suspended from bracket 576 such that its leads 581, 582, and 583, can mate with contacts on PCB 522. In the embodiment illustrated these contacts are through hole pins, but they could, alternatively, be surface mounting pads. Heatsink 538 is similar in concept to heatsink 532, except that rather than having support at both ends of a span, as in 532, heatsink 538 has a single mounting to PCB 522 and a cantilevered structure.

Although not shown, any or all of heatsink 532, 534, 536 and 538 may electrically as well as thermally conductive and may have corresponding edge connection feet. In particular any or all of wing member 556, leg 566, and hangar bracket 576 may have feet for engaging sockets that lie out of the plane of PCB 522, in a manner similar to the descriptions of the other embodiments described above. In the event that leg 566 and either or both of wing member 556 and hangar bracket 576 have feet for structural (and possibly also electrical) connection to an adjacent support or cold rail, PCB 522 can receive structural support from both sides, rather than merely one. That is, PCB 522 can be the middle member of a structural sandwich, with one support on one side, and another support on the other side.

It will be appreciated that the elements enumerated in this specification as an opening, relief, accommodation, notch, rabbet, through hole opening, through-hole and aperture, among other things, all designate openings.

A preferred embodiment has been described in detail and a number of alternatives have been considered. As changes in or additions to the above described embodiments may be made without departing from the nature, spirit or scope of the invention, the invention is not to be limited by or to those details, but only by the appended claims.

We claim:

1. A heatsink for cooling an electronic device on a printed circuit board (PCB), said heatsink comprising
   a first attachment interface attachable to a mounting surface of the electronic device, said first attachment interface located on a heatsink portion formed to fit with an accommodation in the printed circuit board;
   a second attachment interface attachable to the printed circuit board; and
   a member extending away from said first interface.

2. The heatsink of claim 1 wherein said heatsink is electrically conductive.

3. The heatsink of claim 2 wherein said heatsink has an anchoring foot formed for attachment to a structure located aside from said printed circuit board.

4. The heatsink of claim 2 wherein said heatsink has a foot for connection to an electrical circuit.

5. The heatsink of claim 1 wherein said heatsink further comprises a card extraction tab.

6. The heatsink of claim 1 wherein said heatsink further comprises a first portion oriented to extend outwardly from the plane of the printed circuit board.

7. The heatsink of claim 1 wherein said member includes a first portion extending outwardly from the printed circuit board, and a second portion extending generally laterally from the first portion and separated from the PCB by a gap.

8. The heatsink of claim 1 wherein said member includes a riser extending outwardly from the PCB and a leg extending from the riser generally parallel to, and spaced from, the plane of the PCB.

9. The heatsink of claim 6 wherein said heatsink comprises first and second sections in a parallel, spaced relationship and a third section connecting said first section to said second section.

10. The heatsink of claim 1 wherein a top member extends outwardly from said member.

11. The heatsink of claim 10 wherein said top member has an allowance defined therein allowing introduction of the device therethrough.

12. The heatsink of claim 1 wherein said heatsink has a power device mounted thereon, said power device having leads extending therefrom, said leads being mountable to contacts on the printed circuit board.

13. A heatsink for cooling an electronic device on a printed circuit board (PCB), said heatsink comprising:
   a first attachment interfere attachable to a mounting surface of the electronic device, said first attachment interface located on a heatsink portion formed to fit with an accommodation in the printed circuit board; and
   a second attachment interface attachable to the printed circuit board,
   wherein said first and second attachment interfaces are located on opposite sides of said heatsink.

14. The heatsink of claim 13, said heatsink being chosen from the set of heatsinks consisting of heatsinks wherein:
   (a) said heatsink has said first attachment interface extending through said accommodation;
   (b) said heatsink has said first attachment interface extending part way into said accommodation; and
   (c) said heatsink has first attachment interface exposed by said accommodation.

15. The heatsink of claim 13 wherein said first attachment interface extends through said accommodation and said first attachment interface is chosen from the set of attachment interfaces consisting of
   (a) an attachment interface flush with a surface of said PCB; and
   (b) an attachment interface extending at least partially above said surface of said PCB.

16. The heatsink of claim 13 wherein said heatsink has a stepped portion located to lie in said accommodation.

17. The heatsink of claim 16 wherein said stepped portion has said first attachment interface located to lie flush with a surface of said PCB.

18. A printed circuit board assembly comprising:
   a printed circuit board (PCB) having a first and second surfaces and an opening in said PCB, said opening spanning from said first surface to said second surface;
   a heatsink comprising a first portion being attachable to said first surface, a leg extending through said opening and a casing seat portion extending from said leg, said casing seat portion being attachable to said second surface; and
   an electrical device having a casing mounted to said casing seat portion of said heatsink.

19. The assembly of claim 18, said assembly being chosen from the set of assemblies consisting of assemblies wherein:
   (a) said heatsink has a casing seat portion extending through said opening and said casing is mounted to said casing seat portion;
   (b) said heatsink has a casing seat portion extending part way into said opening and said casing is mounted to said casing seat portion; and
   (c) said heatsink has a casing seat portion exposed by said opening and said casing seat portion is mounted through said opening.

20. The assembly of claim 18 wherein said heatsink has a casing seat portion that extends through said opening and said casing is mounted to said casing seat portion on an interface chosen from the set of interfaces consisting of
   (a) an interface flush with said second surface of said PCB; and
   (b) an interface extending at least partially above said second surface of said PCB.

21. The assembly of claim 18 wherein said heatsink has a casing seat portion that extends part way through said opening and said casing is mounted to said casing seat on an interface lying between said first and second surfaces of said PCB.

22. The assembly of claim 18 wherein said heatsink has a casing seat portion lying flush with said first surface of said PCB and said casing is located at least partially in said opening and is mounted to said casing seat.

23. The assembly of claim 18 wherein said casing and said heatsink form part of an electrically conductive path.

24. The assembly of claim 23 wherein said heatsink constitutes a voltage plane.

25. The assembly of claim 24 wherein said voltage plane is a ground plane.

26. The assembly of claim 23 wherein said heatsink has an electrical contact pin for locating in a socket of installation of said assembly in a computer.

27. The PCB assembly of claim 18 wherein said heatsink has a stepped portion located to lie in said opening.

28. The PCB assembly of claim 27 wherein said stepped portion has a casing seat located to lie flush with said second surface of said PCB.

29. The PCB assembly of claim 27 wherein said first and second surface of said PCB are substantially planar and parallel; said heatsink has a land mounted to said first surface of said PCB and lying in the plane of said first surface; and heatsink has a casing seat lying in a plane parallel to said plane of first surface; and said casing is mounted to said casing seat.

30. The PCB assembly of claim 18 wherein:
   said heatsink has a leg extending through said relief and a casing seat portion extending from said leg and lying along said other face of said PCB;
   and said casing is mounted to said casing seat portion.

31. The PCB assembly of claim 18 wherein said relief has in plan view, a form chosen from the set of shapes consisting of:
   (a) the shape of said casing in plan view;
   (b) a square;
   (c) a rectangle;
   (d) a circle;
   (e) a semicircle;
   (f) a rabbet let into an edge of said PCB; and
   (g) a rabbet let into a corner of said PCB.

32. A PCB assembly as claimed in claim 18 wherein said heatsink has a member standing outwardly from said one face of said PCB.

33. A PCB assembly as claimed in claim 32 wherein said heatsink has a leg extending outwardly from said first surface of said PCB; said leg has a distal end; and said heatsink has a wing extending from said distal end in spaced relationship from said first surface of said PCB.

34. The PCB assembly of claim 33 wherein said first surface of said PCB is substantially planar, and said wing has a support foot for mating with an adjacent structure located out of the plane of said first surface of said PCB.

35. The PCB assembly of claim 34 wherein said heatsink is electrically conductive and said foot is shaped for engagement with an electrically conductive socket.

36. The PCB assembly of claim 18 wherein another electrical device has a casing mounted to said heatsink and said other electrical device has at least one electrical contact connected to said first surface of said PCB.

37. The PCB assembly of claim 18 wherein:
said opening is selected from the set of openings consisting of
  (a) an aperture having a continuous closed periphery let through the body of said PCB;
  (b) a rabbet extending inwardly from an edge of said PCB; and
  (c) a rabbet formed at a corner of said PCB; and
first and second surfaces of said PCB arc substantially planar and mutually parallel;
said heatsink has at least one substantially planar footing for mounting to said first surface;
said heatsink has a stepped portion adjoining said footing, said stepped portion being located to extend through said relief;
said stepped portion having a substantially planar casing seat lying flush with said second surface;
said second surface having an electrical contact footprint adjacent to said relief;
said casing is mounted to said casing seat and said at least one contact is connected to said footprint;
said heatsink has a leg connected to said land portion, said leg extending substantially perpendicularly away from said one face of said PCB and having a distal end;
said heatsink has a wing extending from said distal end of said leg substantially parallel to, and spaced from said first surface of said PCB; and
said wing has a support foot for mating with a mounting socket, said foot lying out of the plane of said first surface.

38. A printed circuit board assembly comprising:
a printed circuit board. (PCB) having a surface, said surface having an accommodation to fit with a component;
a heatsink comprising
  a first attachment interface attachable to a mounting surface of the electronic device, said first attachment interface located on a heatsink portion formed to seat within said accommodation of the PCB;
  a second attachment interface attachable to the printed circuit board; and
  a member extending away from said first interface; and
an electrical device having a casing and at least one electrical contact, said electrical contact being mounted to said surface, said casing being mounted to said heatsink.

39. The heatsink of claim 38 wherein said heatsink is electrically conductive.

40. The heatsink of claim 39 wherein said heatsink has an anchoring foot formed for attachment to a structure located aside from said printed circuit board.

41. The heatsink of claim 38 wherein said heatsink further comprises a card extraction tab.

42. The heatsink of claim 38 wherein said heatsink fisher comprises a first portion oriented to extend outwardly from the plane of the printed circuit board.

43. The heatsink of claim 38 wherein said member includes a first portion extending outwardly from the printed circuit board, and a second portion extending generally laterally from the first portion and separated from the PCB by a gap.

* * * * *